United States Patent
Hurt et al.

(10) Patent No.: US 7,226,216 B2
(45) Date of Patent: Jun. 5, 2007

(54) OPTOELECTRONIC TRANSMISSION AND/OR RECEPTION ARRANGEMENT

(75) Inventors: Hans Hurt, Regensburg (DE); Thomas Killer, Hohenschambach (DE); Josef Wittl, Parsberg (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/836,605

(22) Filed: Apr. 29, 2004

(65) Prior Publication Data

US 2004/0247256 A1 Dec. 9, 2004

(30) Foreign Application Priority Data

Apr. 29, 2003 (DE) ................ 103 19 900

(51) Int. Cl.
*G02B 6/36* (2006.01)

(52) U.S. Cl. ..................................... 385/88

(58) Field of Classification Search ............... 385/8, 385/88–93
See application file for complete search history.

(56) References Cited

U.S. PATENT DOCUMENTS

| | | | |
|---|---|---|---|
| 5,123,066 A | 6/1992 | Acarlar | |
| 6,021,238 A | 2/2000 | Spaeth | |
| 6,071,016 A | 6/2000 | Ichino et al. | |
| 6,181,720 B1 * | 1/2001 | Kanemoto et al. | 372/43.01 |
| 6,414,387 B1 * | 7/2002 | Hara et al. | 257/691 |
| 6,550,982 B2 * | 4/2003 | Auburger et al. | 385/88 |
| 6,677,674 B2 * | 1/2004 | Nagao | 257/724 |
| 6,805,495 B2 * | 10/2004 | Yoshikawa et al. | 385/92 |
| 6,877,908 B2 * | 4/2005 | Nakanishi et al. | 385/78 |
| 2001/0017964 A1 | 8/2001 | Setoguchi | |
| 2002/0017714 A1 | 2/2002 | Choi | |
| 2003/0077053 A1 | 4/2003 | Panicker et al. | |
| 2003/0235375 A1 * | 12/2003 | Kamath et al. | 385/92 |
| 2006/0013542 A1 * | 1/2006 | Schunk | 385/92 |

FOREIGN PATENT DOCUMENTS

| | | |
|---|---|---|
| DE | 199 09 242 A1 | 8/2000 |
| DE | 199 18 860 C2 | 5/2001 |
| DE | 100 01 873 A1 | 8/2001 |
| EP | 1 170 609 A2 | 1/2002 |

OTHER PUBLICATIONS

"10 Gbit/s Optical Front End Using Si-Bipolar Preamplifier IC, Flipchip APD, And Slant-End Fibre", Electronics Letters, Aug. 29, 1991, vol. 27, No. 18, pp. 1602-1605.

* cited by examiner

*Primary Examiner*—Sung Pak
*Assistant Examiner*—Tina M. Wong
(74) *Attorney, Agent, or Firm*—Eschweiler & Associates, LLC

(57) ABSTRACT

An optoelectronic transmission and/or reception arrangement with an optical unit having a transmission component and/or a reception component, an electrical circuitry component for the transmission component and/or the reception component, a circuit carrier, on which the components are mounted and contact-connected, and a coupling part for receiving and coupling at least one optical fiber which can be optically coupled to the transmission component and/or the reception component. The electrical contact-connection of the circuit carrier is effected via the coupling part.

23 Claims, 5 Drawing Sheets

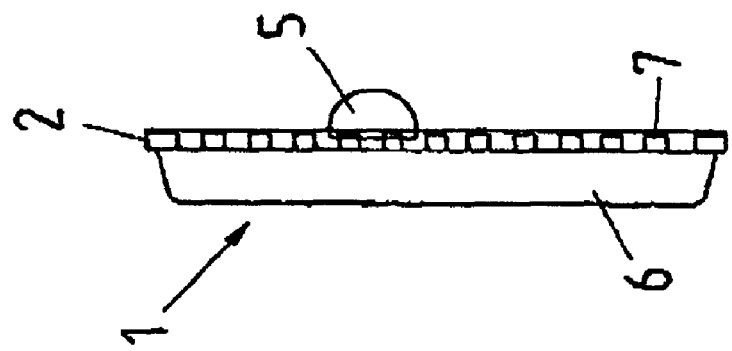
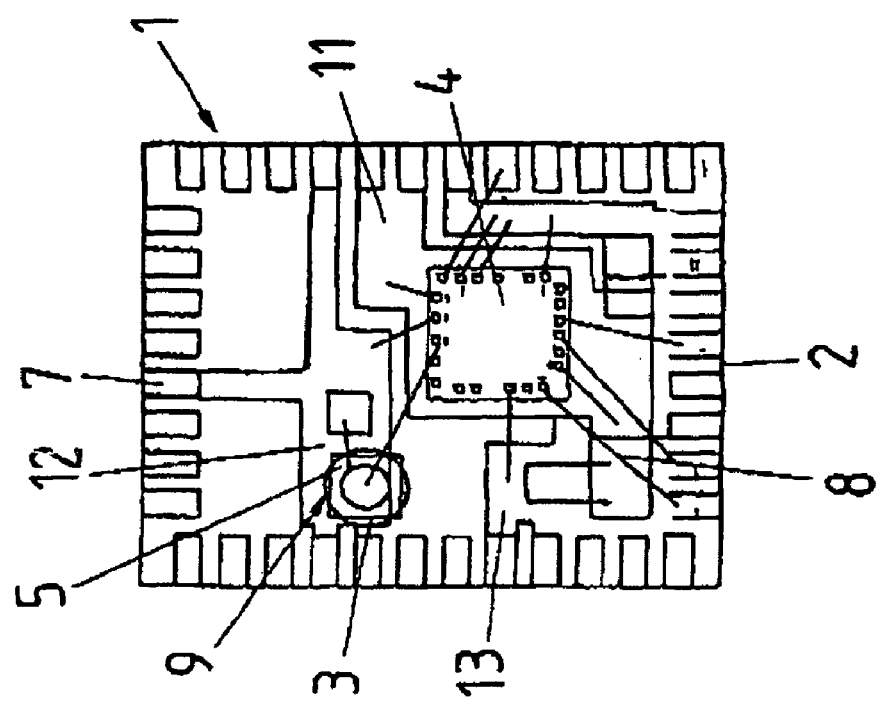

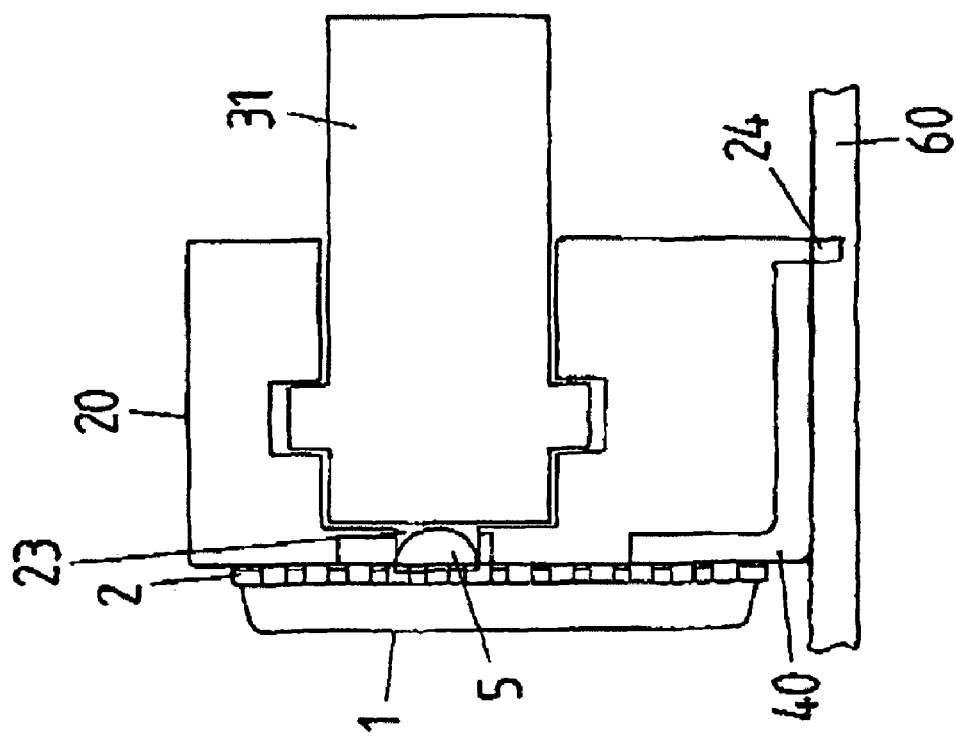
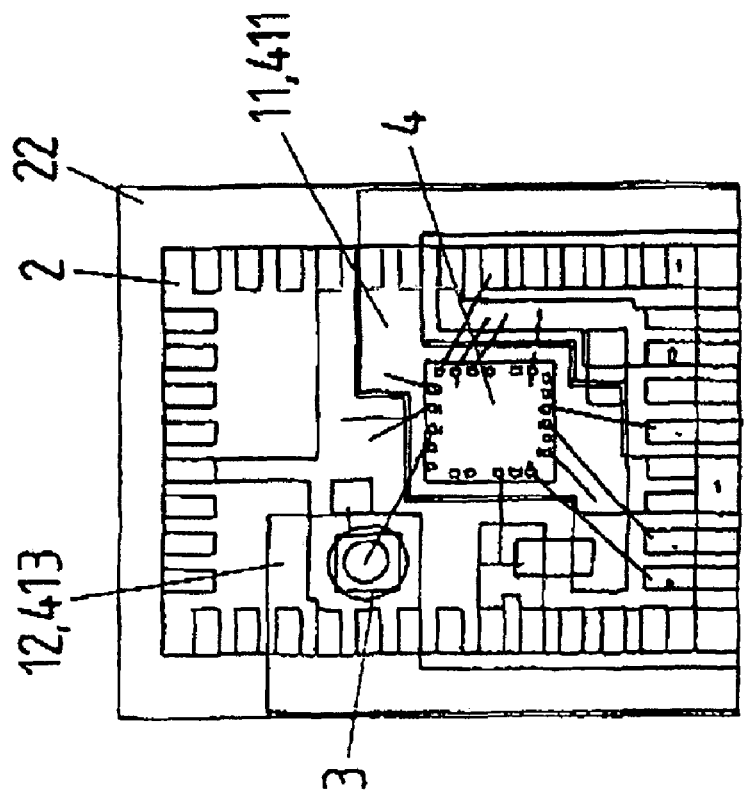

OPTOELECTRONIC TRANSMISSION AND/OR RECEPTION ARRANGEMENT

FIELD OF THE INVENTION

The invention relates to an optoelectronic transmission and/or reception arrangement, and in particular, to an electrical contact-connection of a surface-mountable optoelectronic chip and a simultaneous optical coupling of the chip to an optical fiber such as a POF fiber (plastic optical fiber).

BACKGROUND OF THE INVENTION

DE 199 09 242 A1 discloses an optoelectronic module in which a leadframe with an optoelectronic transducer is positioned in a module housing and potted with a light-transmissive, moldable material. Light is coupled in or out via an optical fiber coupled to a connector of the module housing. The driver module or reception module for the optoelectronic transducer is also situated on the leadframe.

Furthermore, optoelectronic transmission and reception arrangements are known in which the electro-optical or optoelectronic transducers and also the associated circuitry modules (driver module or reception amplifier module) are mounted on a transceiver circuit board. In this case, the individual circuit boards may be arranged closely spaced apart from one another in a rack. An optical fiber is coupled parallel to the transceiver circuit board. For this purpose, the contact legs of the respective transducer module are bent through 90° and mounted on the transceiver circuit board for example using THT technology (through hole technology).

A corresponding arrangement in accordance with the prior art is illustrated in FIG. 5. An optical unit 100 and also associated active and/or passive electrical components 130 are arranged on a circuit board 120. The optical unit 100 is an electro-optical or optoelectrical transducer such as a laser diode, a photodiode or an LED. For the coupling of an optical fiber, provision is made of a plug receptacle 110 arranged in parallel orientation with respect to the circuit board 120, so that an optical waveguide is plugged in parallel to the circuit board 120. The optical unit 100 receives or transmits light likewise in a direction parallel to the circuit board 120, so that it is possible to effect direct coupling to an optical waveguide inserted into the plug receptacle 110.

The small connecting legs (leads) 101 of the optical unit 100 are bent through 90° and mounted on the printed circuit board 120 for example using THT technology. FIG. 5 furthermore illustrates an interface 40 for radio-frequency electrical signals.

In known modifications of the prior art illustrated in FIG. 5, the optical unit 100 is contact-connected to the transceiver circuit board 120 by means of a flexboard, that is to say by means of a flexible structure containing patterned conductor tracks. The flexboard is electrically connected to the optical unit 100, on the one hand, and is electrically connected to the circuit board 120, on the other hand. In a further configuration, the optical unit 100 is soldered in a direction parallel to the circuit board plane directly onto the latter.

There is a need for optoelectronic transmission and/or reception arrangements in which the transmission components of reception components can be arranged in surface-mountable devices (SMD—Surface Mounted Device) and can correspondingly be mounted on a printed circuit board in a simple manner using the standards of SMD technology. The known arrangements are not suitable for this.

When the optoelectronic components are arranged in SMD devices, it must be taken into consideration that the optical axes are typically arranged perpendicular or approximately perpendicular to the device plane. Therefore, when an SMD device is arranged on a transceiver circuit board, there is the problem of either deflecting through 90° the beam path of an optical fiber that is coupled parallel to the circuit board or rotating the device through 90° by means of an auxiliary construction.

Furthermore, in the case of solutions with SMD devices, it must be taken into consideration that the precise joining of the receptacle represents a considerable cost factor. Since a receptacle, depending on its embodiment, also has to completely or partially transfer mechanical forces, it is necessary for the receptacle to be solidly mechanically anchored in the housing or in the main circuit board (motherboard). In this case, it must be ensured that mechanical forces that occur do not influence or even destroy the optical coupling between optical unit and receptacle.

SUMMARY OF THE INVENTION

Taking the abovementioned prior art as a departure point, the present invention provides an optoelectronic transmission and/or reception arrangement which, even with the use of SMD devices for the optoelectronic and electrical components, enables reliable coupling of an optical waveguide and is distinguished by a compact and cost-effective construction.

Accordingly, the solution according to the invention is distinguished by the fact that the electrical contact-connection of the circuit carrier, which carries the transmission component and/or the reception component and also the assigned circuit components such as driver chip and reception amplifier chip, is effected via the coupling part, that is to say via the part which serves for receiving and coupling an optical fiber. Said coupling part is then in turn connected to a main circuit board (motherboard).

The solution according to the invention is thus based on the concept of performing the contact-connection of the circuit carrier via the receiving and coupling structure for the optical fiber. This results in a synergetic effect insofar as the coupling part serves not only for mechanically receiving and positioning an optical fiber but also for carrying current. What is more, heat which arises in the optoelectronic and electrical components can be effectively dissipated from the circuit carrier via the coupling part.

The solution according to the invention is particularly compact insofar as the optical unit with the circuit carrier, the optoelectronic component and the electrical circuitry component only has to be placed onto the coupling part for receiving an optical fiber. The electrical contact-connection and mechanical stabilization of the arrangement is then effected via the coupling part. A separate auxiliary construction for the fixing and arrangement of the optical unit is not necessary.

The solution according to the invention is suitable in particular for configurations in which the optical unit is realized as an SMD device. In this case, the SMD device is placed directly onto a surface of the coupling part which has suitable electrical contacts for this.

In this case, a preferred refinement provides for the coupling part to have electrical contacts with contact regions via which, on the one hand, the circuit carrier and, on the other hand, a main circuit board can be contact-connected. For this purpose, the coupling part preferably has a leadframe having contact regions with respect to the circuit carrier, on the one hand, and with respect to the main circuit board, on the other hand. In principle, however, the electrical contacts may also be provided in a different way, for instance by means of a flexible film with correspondingly patterned conductor regions or by means of metal structures introduced into a plastic body in accordance with MIB technology (MIB—Metal Interconnect Technology).

In order to produce a coupling part with a leadframe, a plane leadframe is preferably etched or stamped in a suitable manner and then embedded in a polymer body, which constitutes the actual receiving and coupling part for an optical fiber. There are two preferred possibilities for fixing the leadframe of the coupling part on the main circuit board. In one alternative, the leadframe is bent through 90°, said leadframe serving, on the one hand, as a soldering area for the optical unit and, on the other hand, as a soldering area for the main circuit board. The coupling part is then likewise formed as an SMD device. As an alternative, the coupling part may also be fixed on the main circuit carrier using THT technology, the individual small contact legs being led through suitable holes in the main circuit board. In this variant, the leadframe is not bent through 90° after encapsulation with plastic by injection molding.

In a preferred refinement of the invention, the circuit carrier has at least one opening. In this case, the transmission component or reception component is arranged on one side of the circuit carrier in such a way that the optical path from and to the transmission and/or reception component runs through the opening to the other side of the circuit carrier. This other side is the rear side in this case, that is to say light is coupled in and out on the rear side. In this case, the rear side of the circuit carrier is connected to the coupling part, so that the light that is coupled in or out can be coupled directly to an optical fiber plugged into a coupling part.

In a further advantageous refinement of the invention, adjustment structures are provided both at the coupling part and at the circuit carrier, said adjustment structures enabling passive orientation of optical unit and coupling part. This can be done in diverse ways. By way of example, depressions are produced in the circuit carrier for instance by means of a half-etch technique, said depressions corresponding to matching mating structures in the coupling part. The coupling part then has projections at its side facing the optical unit, said projections corresponding to depressions such as a groove or a hole at the rear side of the optical unit. Of course, it is also possible to form suitable depressions in the coupling part and projections at the optical unit.

In a particularly preferred refinement, an optical lens is situated in the opening of the circuit carrier for the provision of an optical path. In this case, the optical lens projects over the rear side of the circuit carrier and effects a mechanical coupling of the circuit carrier to the coupling part and a simultaneous reciprocal adjustment. The optical lens thus has an adjustment function in addition to its light-shaping function. In this case, the lens is shaped such that it centers itself in the opening of the circuit carrier. In this case, there is likewise an opening or a hole in that side of the coupling part which faces the circuit carrier, the lens being automatically mechanically centered in said opening or hole when the optical unit is placed onto the coupling part. This provides a cost-effective and precise adjustment of the optical axes of the optical unit and of the coupling part.

The circuit carrier of the optical unit is preferably formed as a segmented baseplate, the individual segments of which may have a different potential. The segmentation of the circuit carrier or baseplate leads to an interruption and electrical segmentation of the baseplate into individual "islands". This provides an increased degree of flexibility for the circuit arrangement. The individual "islands" or segments may serve as contact areas of the circuit since each "island" or each segment may carry a potential required for the circuit.

In a preferred development of this refinement, the leadframe of the coupling part has a segmentation corresponding to the segmentation of the circuit carrier. This results in particularly effective dissipation of heat to the coupling part. In this case, the leadframe of the coupling part is preferably a relatively thick metal having a thickness of preferably greater than or equal to 0.2 mm, particularly preferably greater than or equal to 0.3 mm, so that the heat loss generated in the optical unit can be effectively taken up and emitted to the main circuit board. In this case, the heat generated on a segment of the circuit carrier of the optical unit by a device arranged on the corresponding segment couples through the rear side of the circuit carrier to the leadframe of the coupling part and is passed on by the latter to the main circuit board. The thicker the metal of the leadframe in this case, the higher the thermal capacity of the leadframe and the dissipation of heat to the main circuit board.

The leadframe of the coupling part makes it possible to achieve a suitable adaptation of the pitch (grid of the small contact legs) to the respective requirements ("foot print"). By way of example, wide leads or small contact legs are used for a better heat transport.

In order to fix the coupling part on the main circuit board, a mechanical anchoring structure is preferably integrated into said coupling part, and also facilitates the positioning operation. By way of example, a pin projects from the coupling part in the direction of the main circuit board, and can slide into a corresponding opening in the main circuit board.

A further preferred refinement provides for an optical unit with a transmission component and an optical unit and a reception component to be arranged in a common surrounding housing, which preferably likewise concomitantly surrounds the coupling part. An optical transmission unit and an optical reception unit may be combined to form a transceiver by means of such a surrounding housing.

The common surrounding housing may comprise a plastic, have a sandwich structure with a plastic and an electrically conductive material, or else exclusively comprise a metallic material. The surrounding housing preferably comprises or has an electromagnetically shielding material, so that the surrounding housing simultaneously serves as an EMC shield and the optical unit including its connecting contacts is thus arranged in a manner shielded in a kind of Faraday cage. There is an opening in the surrounding housing only with respect to the main circuit board and with respect to the optical fiber.

The surrounding housing may also have more than two cavities, so that a multiplicity of optical units with transmission components and/or reception components can be arranged in a common surrounding housing, for example if a plurality of transmission components are arranged in an array.

Correspondingly robust design of the surrounding housing makes it possible to utilize the surrounding housing for taking up mechanical forces when an optical plug is plugged into and unplugged from the coupling part. In the case of such a configuration, the surrounding housing is preferably adhesively bonded to the coupling part.

In order to provide a defined potential of the surrounding housing, the latter has a ground connection provided, by way of example, via contact pins of the coupling part or, as an alternative, via dedicated pins or SMD contacts.

A further advantage of using a surrounding housing is that the latter can expediently be employed even when it is merely plugged onto the optical unit and the coupling part, but not adhesively bonded. In the event of the transceiver being soldered by the customer, the optical unit or the SMD chip is fixed in its position with respect to the coupling part by the passive adjustment structures mentioned, even in the event of fusion of the solder connection between SMD chip and coupling part.

The coupling part has an in principle arbitrarily configured receiving and coupling opening for an optical fiber to be coupled. A structure which serves for receiving an optical plug in latching fashion is preferably provided in this case. This may be effected for example by means of a bayonet anchoring known per se. In principle, however, it may also be provided that, instead of a releasable optical plug, an optical stub fiber is arranged fixedly in the coupling part. In this case, the fiber fixedly installed in the coupling part has an interface to an optical fiber at its end projecting from the coupling part (so-called pigtail solution).

The invention is explained in more detail below on the basis of more detailed exemplary embodiments with reference to the figures of the drawings.

BRIEF DESCRIPTION OF THE DRAWINGS

FIG. 1A shows an SMD chip with a transmission component, a driver module and a lens arranged in an opening in a circuit carrier;

FIG. 1B shows a side view of the SMD chip of FIG. 1A;

FIG. 3A shows the arrangement of an SMD chip in accordance with FIGS. 1A, 1B on the end side of a coupling part in accordance with FIGS. 2A, 2B in plan view;

FIG. 3B shows a lateral sectional view of the arrangement of FIG. 3A;

DESCRIPTION OF A PREFERRED EXEMPLARY EMBODIMENT

Figure 2A:
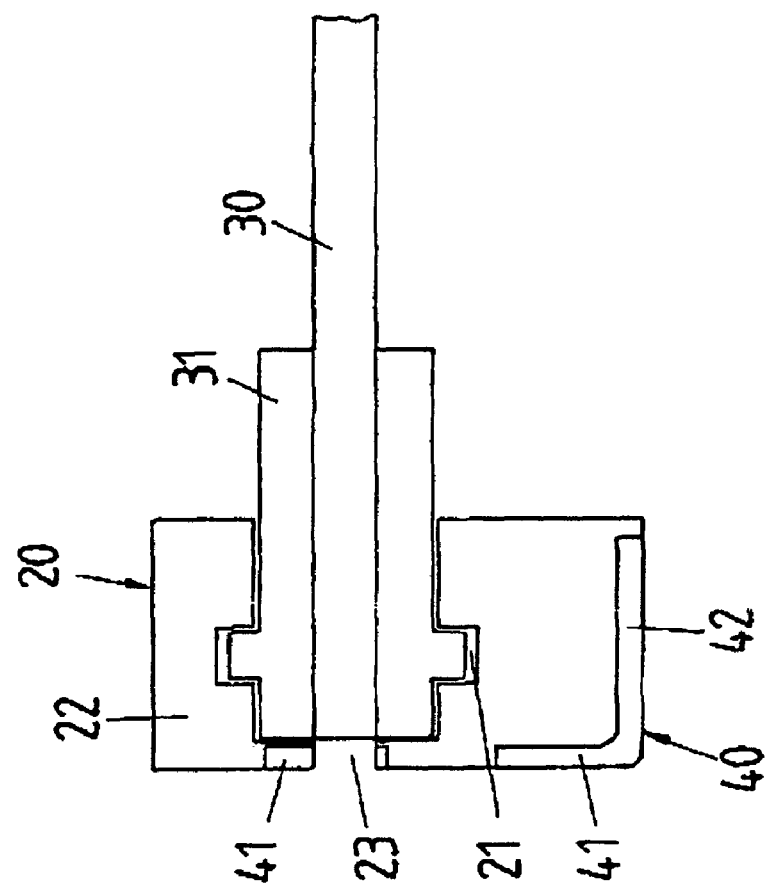
FIG. 2A shows a plan view of the end side of a coupling part for receiving and coupling an optical fiber, which coupling part is to be coupled to an SMD chip in accordance with FIGS. 1A, 1B.

FIGS. 1A, 1B show an optical unit 1 having a circuit carrier or a baseplate 2, on which an optoelectronic transmission component 3 and also an associated driver chip 4 are arranged. The transmission component 3 and the driver chip 4 are connected to contact areas 7 at the edge of the circuit carrier 2 by means of bonding wires 8 in a customary manner. The optical unit 1 is formed as an SMD chip and can accordingly be positioned directly on the surface of a further circuit carrier or a circuit board and be contact-connected there in the soldering bath.

The top side of the circuit carrier 2, provided with the transmission component 3 and the driver chip 4, is completely surrounded by an optically nontransparent potting composition 6, which simultaneously provides a housing of the chip 1.

In the circuit carrier 2, an opening 9 is situated in the region of the transmission component 5, an optical lens 5 that projects with respect to the rear side of the circuit carrier 2 being inserted into said opening. The opening 9 in the circuit carrier 2 provides an optical path to the rear side of the circuit carrier 2 and thus affords the possibility of rear-side coupling to an optical waveguide arranged in a coupling part illustrated in FIGS. 2A, 2B. There is no potting composition 6 situated in the region of the opening 9 in the circuit carrier 2.

In the exemplary embodiment illustrated, but not necessarily, the baseplate (the "diepad") or the circuit carrier 2 has a segmentation which gives rise to electrically isolated islands in the baseplate, which serve as contact areas of the circuit and may in each case carry a potential required for the circuit. By way of example, islands or segments 11, 12, 13 are discernible in FIG. 1A. The baseplate 2 is utilized as part of the circuit in this case.

The SMD chip 1 of FIGS. 1A, 1B is to be understood merely by way of example. In principle, it is possible to use SMD chips of arbitrary construction and design. All that is of importance is that both an optoelectronic transducer and an associated circuitry module are arranged on the SMD chip. Light is coupled into and out of the chip preferably at the rear side through an opening in the baseplate 2.

In a manner corresponding to that in FIGS. 1A, 1B, the optical unit 1 may also be formed as a reception SMD chip. In this case, a reception component is used instead of a transmission component. Instead of a transducer chip, a reception amplifier chip is provided as circuitry element. It is also the case when the optical unit is formed as a reception unit that an optical lens 5 is preferably provided, which is inserted into an opening in the circuit carrier and in this case projects with respect to the rear side of the circuit carrier in order, as will be described below, to bring about a mechanical coupling and adjustment with a coupling part.

Figure 2B:
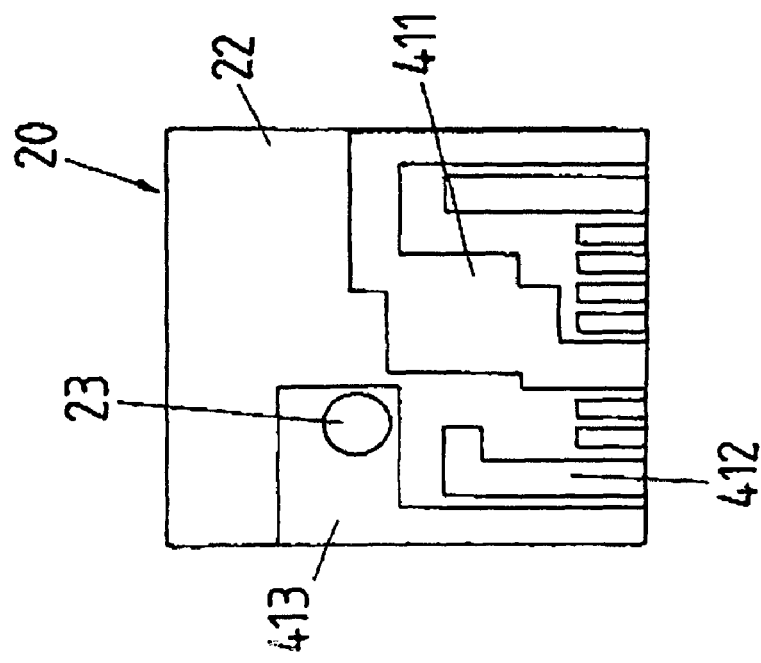
FIG. 2B shows a lateral sectional view of the coupling part of FIG. 2A.

FIGS. 2A, 2B show a coupling part (block) 20, which firstly serves for receiving and coupling (securing) an optical fiber 30. In this case, the optical fiber 30 is arranged in a receiving opening (mounting structure) 21 of the coupling part 20 for example in a manner such that it can be plugged by means of an optical plug 31 illustrated diagrammatically. The coupling part 20 may in principle be an arbitrary mechanical structure enabling connection of an optical fiber. The embodiments illustrated are to be understood merely by way of example. The coupling part may also be referred to as a receptacle or as a plug receptacle.

The coupling part 20 is formed for example as an injection-molded part and has an electrically non-conducting (e.g., polymer) body 22. A leadframe 40 is embedded in the polymer body at the end side, said leadframe having, in the exemplary embodiment illustrated, a first contact region 41 for coupling of the SMD chip of FIGS. 1A, 1B and, on the other hand, a second contact region 42 for arranging the coupling part on a main circuit board (motherboard). In terms of production technology, in this case, firstly a plane leadframe is used and the latter is then bent through 90°. For example, as indicated in FIG. 2B, leadframe 40 includes first contact region 41 extending in a first direction and exposed on a first (e.g., vertical) planar surface of polymer body 22, second contact region 42 extending in a second direction, which is perpendicular to the first direction, and exposed on a second (e.g., horizontal) planar surface of polymer body 22, and a bent portion connecting the first and second contact regions. As a result of this, the coupling part 20 is also embodied as an SMD device.

The leadframe 40 is likewise segmented in its region 41 facing the SMD chip 1, to be precise with the formation of segments whose geometry essentially corresponds to the geometry or at least the location of the segments 11, 12, 13 of the baseplate 2 of the SMD chip 1, cf. FIGS. 1A, 1B. FIG. 2A shows three segments 411, 412, 413 of this type. The corresponding segments serve for taking up and dissipating heat generated on the circuit board 2 of the SMD chip by modules 3, 4 present there. The corresponding modules 3, 4 or segments 11, 12 of the SMD chip 1 are cooled at the rear side by the corresponding segments 411, 413 of the leadframe 40 of the coupling part 20. The heat taken up by the contact region 41 is dissipated to the main circuit board via the contact region 42 of the leadframe 40.

The modules 3, 4 of the SMD chip 1 are cooled very effectively in this way. In this case, temperature requirements can be met more easily as a result of the thermal isolation effected on account of the segmentation. The energy that arises locally can be transported away in a targeted manner via predetermined heat paths through the baseplate 2.

It is pointed out that the contact region 42 with respect to the main circuit board, instead of being embodied in SMD form, may for example also be embodied using THT technology, the legs of the leadframe not being bent and being inserted through holes in the main circuit board (pin through hole).

Situated in the coupling part 20 is a cutout 23, which serves for receiving a structure projecting from the SMD chip. Such a projecting structure, which enables passive adjustment of SMD chip 1 and coupling part 20, is, in particular, the lens 5 of FIGS. 1A, 1B, which fits precisely into the opening 23 in the coupling part and automatically mechanically centers itself there when the SMD chip 1 is placed onto the receptacle 20.

Instead of a lens, mechanical centering and adjustment may also be effected by other passive structures at the SMD chip 1 and at the coupling part 20. Mating structures that respectively correspond to one another are to be used in this case.

The optical fiber 30 introduced into the coupling part 20 is preferably a POF fiber (plastic optical fiber). Accordingly, the transmission component 3 of FIGS. 1A, 1B is preferably a light-emitting diode. In principle, however, the arrangement described can equally be used for glass fibers and multi- or single-mode components. No fundamental changes result in this case.

FIGS. 3A, 3B show the SMD chip 1 mounted onto the coupling part 20. The two parts 1, 20 are oriented by means of the coupling lens 5, which projects at the rear side with respect to the carrier plate 2 of the SMD chip 1 and protrudes into the cutout 23 of the coupling part 20. In this way, the optical axes of the transmission component 3 and of the optical fiber 30 are automatically oriented precisely to one another. In this case, the light emitted by the transmission component 3 is imaged precisely onto the end face of the optical fiber 30 by means of the optical lens 5.

It can readily be seen in FIG. 3A that the segmentations 11, 12 of the carrier plate 2 of the SMD chip 1 and the segmentations 411, 413 of the leadframe 40 of the coupling part 20 essentially correspond to one another, so that heat generated by the transmission component 3 and the driver chip 4 can be dissipated in a targeted and thermally isolated manner.

For improved mechanical fixing of the receptacle 20 on the main circuit board and/or in order to facilitate the operation of positioning the component 20 on a main circuit board 60 (illustrated diagrammatically), a mechanical anchoring structure, for example a projecting pin 24 corresponding to a cutout in the main circuit board 60 may be integrated into the body of the receptacle 20.

Figure 4A:
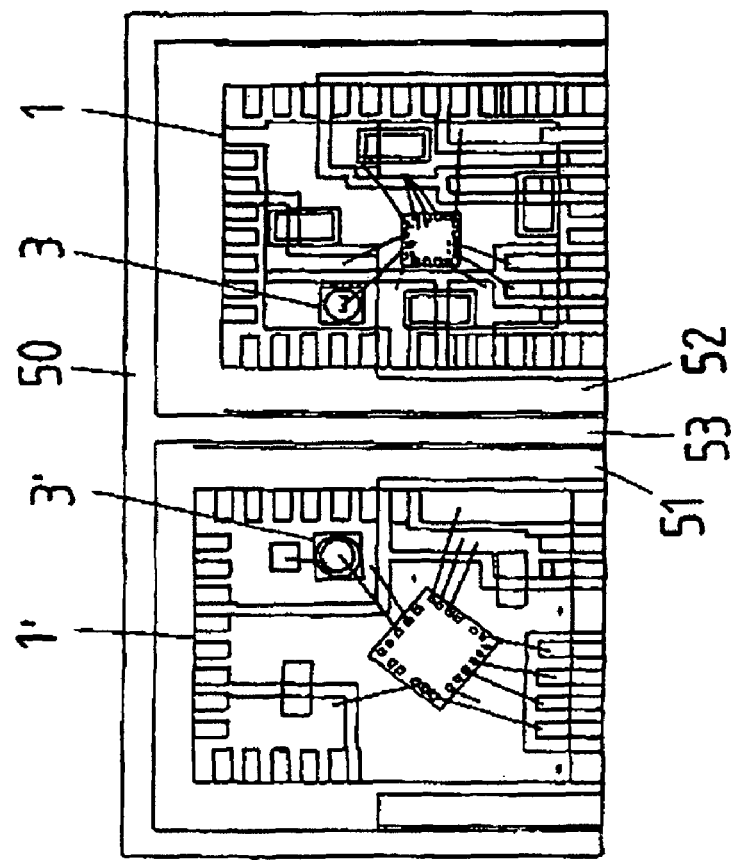
FIG. 4A shows a transceiver with an SMD chip with a transmission component and an SMD chip with a reception component in a common surrounding housing in plan view.
Figure 4B:
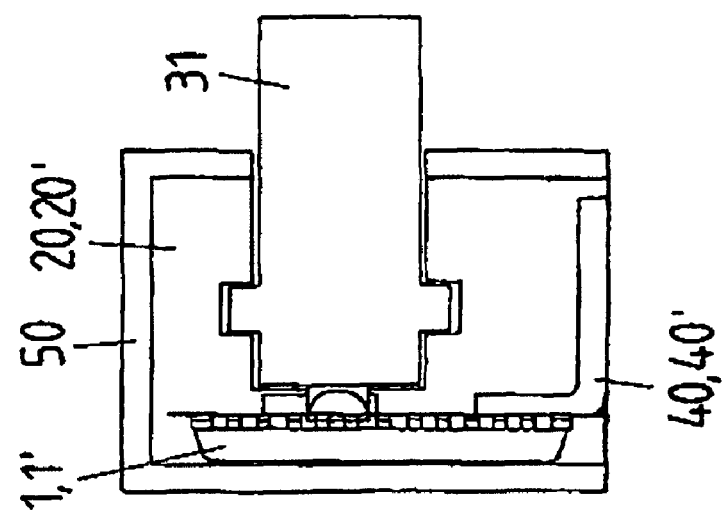
FIG. 4B shows a lateral sectional view of the transceiver of FIG. 4A.
Figure 5:
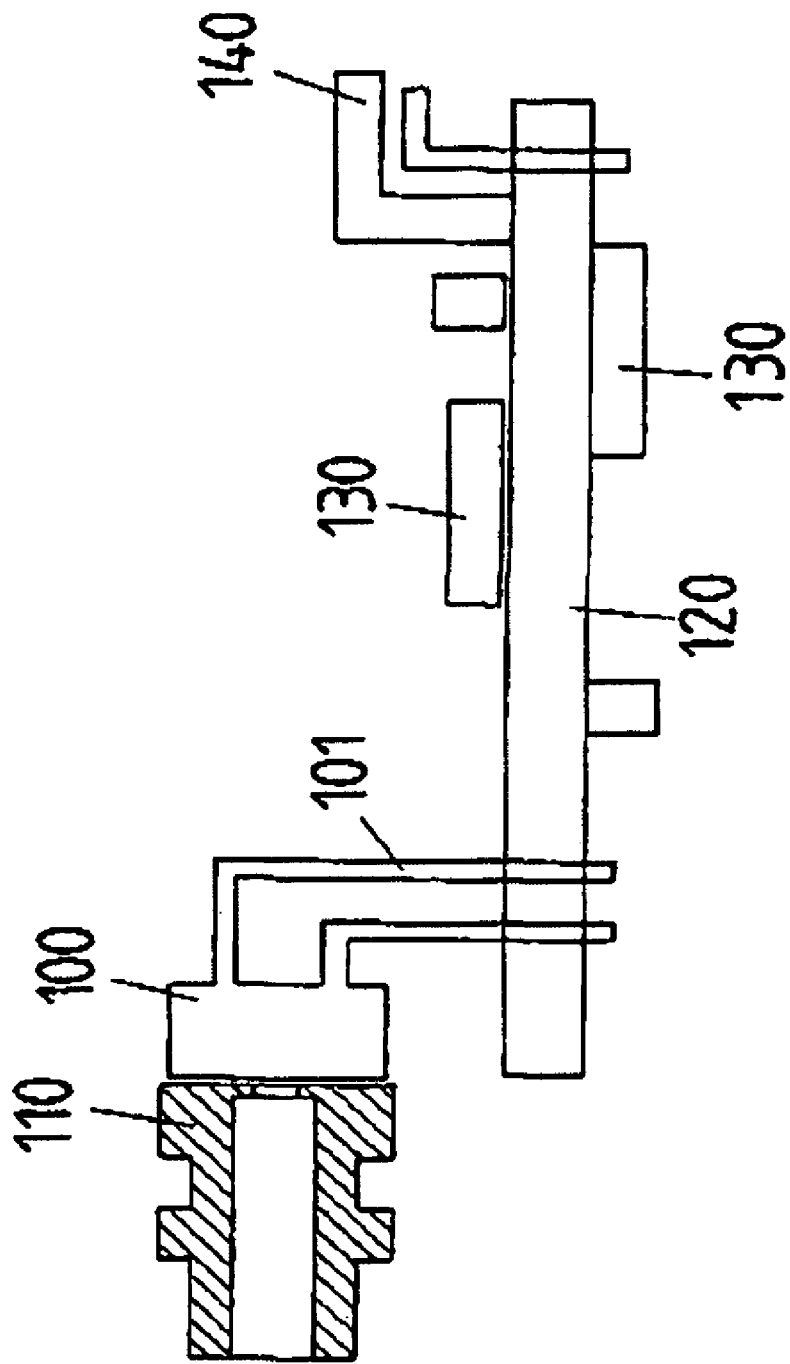
FIG. 5 shows an optoelectronic transmission and/or reception arrangement in accordance with the prior art.

FIGS. 4A, 4B show an exemplary embodiment in which an optical unit 1 with a transmission component 3 and an optical unit 1' with a reception component 3' are arranged next to one another and form a transceiver. Associated coupling parts 20, 20' with leadframes 40, 40' are provided. The individual optical units 1, 1' are connected to one another by means of a surrounding housing 50 or a hood 50 having two cavities.

The hood 50 preferably comprises or has a metallic material, so that the hood 50 is conductive and serves as an EMC shield. As can be gathered from FIG. 4B, there is an opening in the hood 50 only toward the bottom (to the main circuit board) and laterally (for the fiber to be coupled). In this case, the hood 50 preferably also has a certain mechanical stability, so that it can take up plugging forces that occur during the plugging of an optical plug 31. In this case, the hood 50 is preferably adhesively bonded to the coupling part 20, 20'.

A ground connection of the hood 50 can be produced via contact pins of the coupling part 20, 20' or, as an alternative, by separate pins or SMD contacts of the hood 50.

Between its two cavities 51, 52, the hood 50 has a central wall 53, which separates the two optical units 1, 1' and associated coupling parts 20, 22' and shields the transmission and reception components from one another.

The coupling part 20 of the transmission unit and the coupling part 20' of the reception unit may be injection-molded as one part (naturally with two separate leadframes). In this case, provision may be made for leaving a connecting bridge or a connecting web between the two parts 20, 20', preferably at the lower edge and with a thickness of 1 mm for example.

The configuration of the invention is not restricted to the exemplary embodiments presented above. By way of example, it may equally be provided that both a transmission component and a reception component and the respectively associated circuitry modules are arranged on a chip, the emitted and received light being coupled into and out of an optical fiber. In this case, crosstalk between input and output channels is prevented for example by the use of light having different wavelengths and the use of optical filters on the chip.

We claim:

1. An optoelectronic transmission and/or reception arrangement including:
    an optical unit comprising:
        at least one of a transmission component and a reception component,
        an electrical circuitry component for said at least one of the transmission component and the reception component,
        a circuit carrier, on which the components are mounted and contact-connected, and
    a pre-assembled coupling unit configured for receiving and coupling at least one optical fiber such that the at least one optical fiber is optically coupled to the at least one of the transmission component and the reception component, wherein the coupling unit comprises first electrical contacts having first contact regions connected to the circuit carrier and second electrical contacts with second contact regions for connecting the coupling unit to a main circuit board, wherein the electrical contact-connection of the circuit carrier is effected via said first electrical contacts of the coupling unit, wherein the pre-assembled coupling unit is configured to directly receive the at least one optical fiber, and wherein the pre-assembled coupling unit is different from and does not include the optical unit.

2. The arrangement as claimed in claim 1, wherein the coupling unit further comprises a leadframe including first said contact regions connected to the circuit carrier, and including said second contact regions for connecting the coupling unit to the main circuit board.

3. The arrangement as claimed in claim 1, wherein the optical unit is formed as surface-mountable chip which is mounted onto the coupling unit such that electrical contacts of the chip are connected to associated electrical contacts of the coupling unit.

4. The arrangement as claimed in claim 1, wherein the circuit carrier has at least one opening and the at least one of the transmission component and the reception component is arranged on a first side of the circuit carrier in such a way that the optical path from and to the transmission and/or reception component runs through the opening to an opposing second side of the circuit carrier, and wherein the circuit carrier is coupled to the coupling unit on the rear side.

5. The arrangement as claimed in claim 1, further comprising adjustment structures provided at the coupling unit and at the circuit carrier, which enable passive orientation of the parts and said pre-assembled coupling unit for directly receiving and coupling the at least one optical fiber such that the at least one optical fiber is directly optically coupled to the at least one of the transmission component and the reception component.

6. The arrangement as claimed in claim 4, wherein an optical lens is arranged in the opening of the circuit carrier, projects relative to the rear side of the circuit carrier and effects a mechanical coupling and adjustment of the circuit carrier with the coupling unit.

7. The arrangement as claimed in claim 1, wherein the circuit carrier is formed as a segmented baseplate, the individual segments of which have a different potential.

8. The arrangement as claimed in claim 2, wherein the leadframe of the coupling unit is segmented in the contact region with respect to the circuit carrier and has segments corresponding to those of the circuit carrier.

9. The arrangement as claimed in claim 8, wherein the leadframe is formed from a relatively thick metal having a thickness of greater than or equal to 0.2 mm.

10. The arrangement as claimed in claim 9, wherein the thickness of the leadframe metal is greater than or equal to 0.3 mm.

11. The arrangement as claimed in claim 1, wherein the coupling unit has a mechanical anchoring structure for mechanical connection to the main circuit board.

12. The arrangement as claimed in claim 1, wherein the coupling unit is formed as a surface-mountable part.

13. The arrangement as claimed in claim 1, wherein at least one optical unit with a transmission component and an optical unit with a reception component are arranged in a common surrounding housing with two cavities.

14. The arrangement as claimed in claim 13, wherein the surrounding housing concomitantly surrounds the coupling unit associated with the respective optical unit.

15. The arrangement as claimed in claim 13, wherein the surrounding housing comprises an electromagnetically shielding material.

16. The arrangement as claimed in claim 13, wherein the coupling unit, for the two circuit carriers or optical units, is embodied in one part with regard to its mechanical structures, two partial regions connected to one another by a connecting web preferably being formed.

17. An optoelectronic transmission/reception unit comprising:

a coupling block including:

an electrically non-conducting body having a first surface and a second surface extending perpendicular to the first surface, and a leadframe formed on the first and second surfaces of the electrically non-conducting body, the leadframe including a first contact region exposed on the first surface, a second contact region exposed on the second surface, and a bent portion connecting the first and second contact regions;

a circuit carrier mounted on the second surface of the coupling block, the circuit carrier including at least one contact area electrically connected to the second contact region of the leadframe;

at least one optoelectronic component mounted on the circuit carrier and electrically connected to said at least one contact area, the optoelectronic component including at least one of a transmission component and a reception component; and at least one circuit component mounted on the circuit carrier and electrically connected to at least one of the plurality of contact areas and the optoelectronic component, wherein the coupling block further comprises a mounting structure for securing at least one optical fiber such that an end of the optical fiber is positioned adjacent to and optically coupled with the optoelectronic component.

18. The optoelectronic transmission/reception unit according to claim 17, wherein the electrically non-conducting body defines an opening through the second surface, and wherein the optoelectronic component is positioned opposite to the opening such that the optical fiber is optically coupled with the optoelectronic component through the opening.

19. An optoelectronic transmission/reception arrangement comprising:

a main circuit board defining a plane and having a plurality of contact regions formed on a surface thereof; and an optoelectronic unit including:

a coupling block including an electrically non-conducting body having a first surface mounted on the surface of the main circuit board, and a second surface extending perpendicular to the first surface, the coupling block also including a leadframe including a first contact region formed on the first surface and electrically connected to at least one of the plurality of contact regions formed on the surface of the main circuit board, a second contact region exposed on the second surface, and a bent portion connecting the first and second contact regions;

a circuit carrier mounted on the second surface of the coupling block, the circuit carrier including at least one contact area electrically connected to the second contact region of the leadframe;

at least one optoelectronic component mounted on the circuit carrier and electrically connected to said at least one contact area, the optoelectronic component including at least one of a transmission component and a reception component; and at least one circuit component mounted on the circuit carrier and electrically connected to at least one of the plurality of contact areas and the optoelectronic component, wherein the coupling block further comprises a mounting structure for securing at least one optical fiber such that a portion of the optical fiber connected to the mounting structure is parallel to the plane defined by the main circuit board, and such that an end of the optical fiber is positioned adjacent to and optically coupled with the optoelectronic component.

20. The optoelectronic transmission/reception arrangement according to claim 19, wherein the electrically non-conducting body defines an opening through the first surface, and wherein the optoelectronic component is positioned opposite to the opening such that the optical fiber is optically coupled with the optoelectronic component through the opening.

21. An optoelectronic transmission/reception arrangement comprising:

a pre-assembled optical unit comprising:
at least one transmission component, or at least one reception component, or both;
an electronic circuit component configured to electrically communicate with the at least one transmission component, or the at least one reception component, or both;
a circuit carrier, on which the components are mounted and contact-connected; and a main circuit board;

a pre-assembled coupling unit comprising:
first electrical contacts having first contact regions connected to the circuit carrier; and
second electrical contacts with second contact regions connected to the main circuit board; and
the coupling unit configured to directly receive and structurally couple at least one optical fiber.

22. The optoelectronic transmission/reception arrangement according to claim 21, wherein the pre-assembled optical unit and the pre-assembled coupling unit are fixedly attached.

23. An optoelectronic transmission/reception arrangement comprising:

an optical unit assembly comprising:
a lens configured to direct light to at least one of the following comprising: at least one fiber optic, at least one transmission component, and at least one reception component;
at least one electronic component configured to communicate with a device comprising, the at least one transmission component, the at least one reception component and the at least one fiber optic;
a main circuit board configured to mount the components;
a coupling unit assembly configured to directly receive and couple the at least one fiber optic; and
wherein the coupling unit assembly further comprises a leadframe including a first contact region connected to the main circuit board, and including a second contact region for connecting the coupling unit assembly to the main circuit board.

* * * * *